(12) United States Patent
Brady et al.

(10) Patent No.: US 10,804,844 B2
(45) Date of Patent: Oct. 13, 2020

(54) VOLTAGE CONTROLLED OSCILLATORS WITH WIDE TUNING RANGE AND LOW PHASE NOISE

(71) Applicant: MACOM Technology Solutions Holdings, Inc., Lowell, MA (US)

(72) Inventors: Ronan Brady, Ballincollig (IE); Shane Collins, Tivoli (IE)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 252 days.

(21) Appl. No.: 15/407,430

(22) Filed: Jan. 17, 2017

(65) Prior Publication Data
US 2018/0205344 A1    Jul. 19, 2018

(51) Int. Cl.
*H03B 5/12* (2006.01)

(52) U.S. Cl.
CPC ......... *H03B 5/1225* (2013.01); *H03B 5/1218* (2013.01); *H03B 5/1228* (2013.01); *H03B 5/1231* (2013.01); *H03B 5/1265* (2013.01); *H03B 2200/004* (2013.01); *H03B 2200/0072* (2013.01)

(58) Field of Classification Search
CPC ..... H01L 27/0808; H01L 29/94; H03B 27/00; H03B 5/00; H03B 5/1225; H03B 5/1231; H03B 5/1218; H03B 5/1228; H03B 5/1265; H03B 2200/004; H03B 2200/0072
USPC .......................... 331/167, 117 FE, 177 V, 179
See application file for complete search history.

(56) References Cited

U.S. PATENT DOCUMENTS

| | | | |
|---|---|---|---|
| 3,252,108 A | 5/1966 | Gregory | |
| 4,868,526 A | 9/1989 | Camiade et al. | |
| 5,053,726 A | 10/1991 | Christopher et al. | |
| 8,264,293 B2 * | 9/2012 | Yun ...................... | H03B 5/1225 331/117 FE |
| 8,436,689 B2 * | 5/2013 | Lee ........................ | H03B 27/00 331/117 FE |
| 9,640,532 B2 * | 5/2017 | Gathman ................ | H01L 28/86 |

OTHER PUBLICATIONS

U.S. Appl. No. 15/331,991, filed Oct. 24, 2016, Brady et al.

* cited by examiner

*Primary Examiner* — Arnold M Kinkead
(74) *Attorney, Agent, or Firm* — Thomas | Horstemeyer, LLP; Jason M. Perilla

(57) ABSTRACT

A voltage controlled oscillator includes a variable capacitance circuit having a plurality of variable capacitance elements, each having a capacitance that is a function of a tuning voltage, two or more oscillator core circuits, each operable over a specified frequency band, and inductive elements connected between the variable capacitance circuit and the oscillator core circuits.

21 Claims, 7 Drawing Sheets

VOLTAGE CONTROLLED OSCILLATORS WITH WIDE TUNING RANGE AND LOW PHASE NOISE

BACKGROUND

Technical Field

The disclosed technology relates to electronic oscillators and, more particularly, to voltage controlled oscillators with a wide tuning range and low phase noise. The voltage controlled oscillators may be fabricated in a single compact laminate package.

Discussion of Related Art

A voltage controlled oscillator (VCO) is an electronic oscillator whose oscillation frequency is controlled by a tuning voltage. The tuning voltage determines the oscillation frequency. VCOs may be used, for example, in phase locked loops, function generators and frequency synthesizers.

Voltage controlled oscillators may have various ranges of output frequencies. Some may have a narrow frequency range, where others have a relatively wide tuning range. Some applications require a wide tuning range, such as for example 3 GHz. Such applications also require low phase noise. However, conventional voltage controlled oscillators having a wide tuning range are typically characterized by high phase noise.

A further difficulty with voltage controlled oscillators relates to packaging. Voltage controlled oscillators typically utilize an LC resonator to establish the operating frequency of the oscillator. The capacitive element of the LC resonator may include a fixed capacitor and a variable capacitor. The variable capacitor may be implemented as a varactor diode which tunes the resonator in response to a tuning voltage. As is known, inductors and capacitors may be difficult to fabricate in monolithic semiconductor devices, particularly where the values of the LC resonator elements are dictated by the operating frequency range of the voltage controlled oscillator.

Accordingly, there is a need for voltage controlled oscillators which have a wide tuning range and which are characterized by low phase noise. Further, there is a need for compact, low cost packaging of such voltage controlled oscillators.

SUMMARY

The inventors have recognized that a wide tuning range and low phase noise can be achieved by a digitally programmable VCO circuit which operates over multiple small bandwidths. The VCO circuit may include one or more oscillator core circuits, a variable capacitance circuit and inductive elements coupled between the variable capacitance circuit and the one or more oscillator core circuits. The variable capacitance circuit may be programmable for operation in different frequency bands and may be tunable within a selected frequency band. The inductive elements may be formed in a laminate package.

In accordance with embodiments, a voltage controlled oscillator comprises a variable capacitance circuit comprising a plurality of variable capacitance elements, each having a capacitance that is a function of a tuning voltage, two or more oscillator core circuits, each operable over a specified frequency band, and inductive elements connected between the variable capacitance circuit and the oscillator core circuits.

In some embodiments, the variable capacitance circuit is programmable in response to a control signal for operation in a selected frequency band.

In some embodiments, the variable capacitance circuit includes at least one programmable capacitance element.

In some embodiments, the inductive elements include a first inductive element and a second inductive element and the variable capacitance circuit includes first and second branches connected to the first and second inductive elements, respectively.

In some embodiments, each of the oscillator core circuits includes at least one programmable capacitance circuit.

In some embodiments, each of the oscillator core circuits includes first and second negative resistance circuits.

In some embodiments, a first input of each of the oscillator core circuits is coupled by a first inductive element of the inductive elements to a first terminal of the variable capacitance circuit and a second input of each of the oscillator core circuits is coupled by a second inductive element to a second terminal of the variable capacitance circuit.

In some embodiments, the inductive elements are formed on a laminate substrate.

In some embodiments, the variable capacitance circuit and the oscillator core circuits are formed on one or more semiconductor substrates, and the one or more semiconductor substrates are mounted on the laminate substrate.

In some embodiments, the variable capacitance circuit and the oscillator core circuits are formed on a single semiconductor substrate and the semiconductor substrate is mounted on the laminate substrate.

In some embodiments, the variable capacitance circuit comprises varactor elements, each varactor element including two or more branches, each branch comprising a varactor diode and a switch connected in series.

In some embodiments, the programmable capacitance element includes a plurality of parallel branches, each parallel branch comprising a switch connected in series with a capacitor.

In some embodiments, the two or more oscillator core circuits comprise a high band oscillator core circuit, a mid band oscillator core circuit and a low band oscillator core circuit.

In some embodiments, the voltage controlled oscillator further comprises a control circuit configured to provide control signals to the variable capacitance circuit and to the oscillator core circuits.

In accordance with further embodiments, a voltage controlled oscillator comprises a variable capacitance circuit comprising a plurality of variable capacitance elements, each responsive to a tuning voltage, two or more oscillator core circuits, each of the oscillator core circuits operable over a specified frequency range, wherein the variable capacitance circuit and the two or more oscillator core circuits are formed on one or more semiconductor substrates, and inductive elements formed on a laminate substrate and connected between the variable capacitance circuit and the oscillator core circuits, wherein the one or more semiconductor substrates are mounted on the laminate substrate and are electrically connected to the laminate substrate.

In accordance with further embodiments, a voltage controlled oscillator comprises a variable capacitance circuit comprising a plurality of variable capacitance elements, each having a capacitance that is a function of a tuning voltage and each being programmable for operation in a frequency band that is selected from multiple frequency bands; an oscillator core circuit that is operable in the multiple frequency bands and that is programmable for operation in the selected frequency band; and inductive elements connected between the variable capacitance circuit and the oscillator core circuit.

BRIEF DESCRIPTION OF DRAWINGS

For a better understanding of the disclosed technology, reference is made to the accompanying drawings, which are incorporated herein by reference and in which.

DETAILED DESCRIPTION

Figure 1:
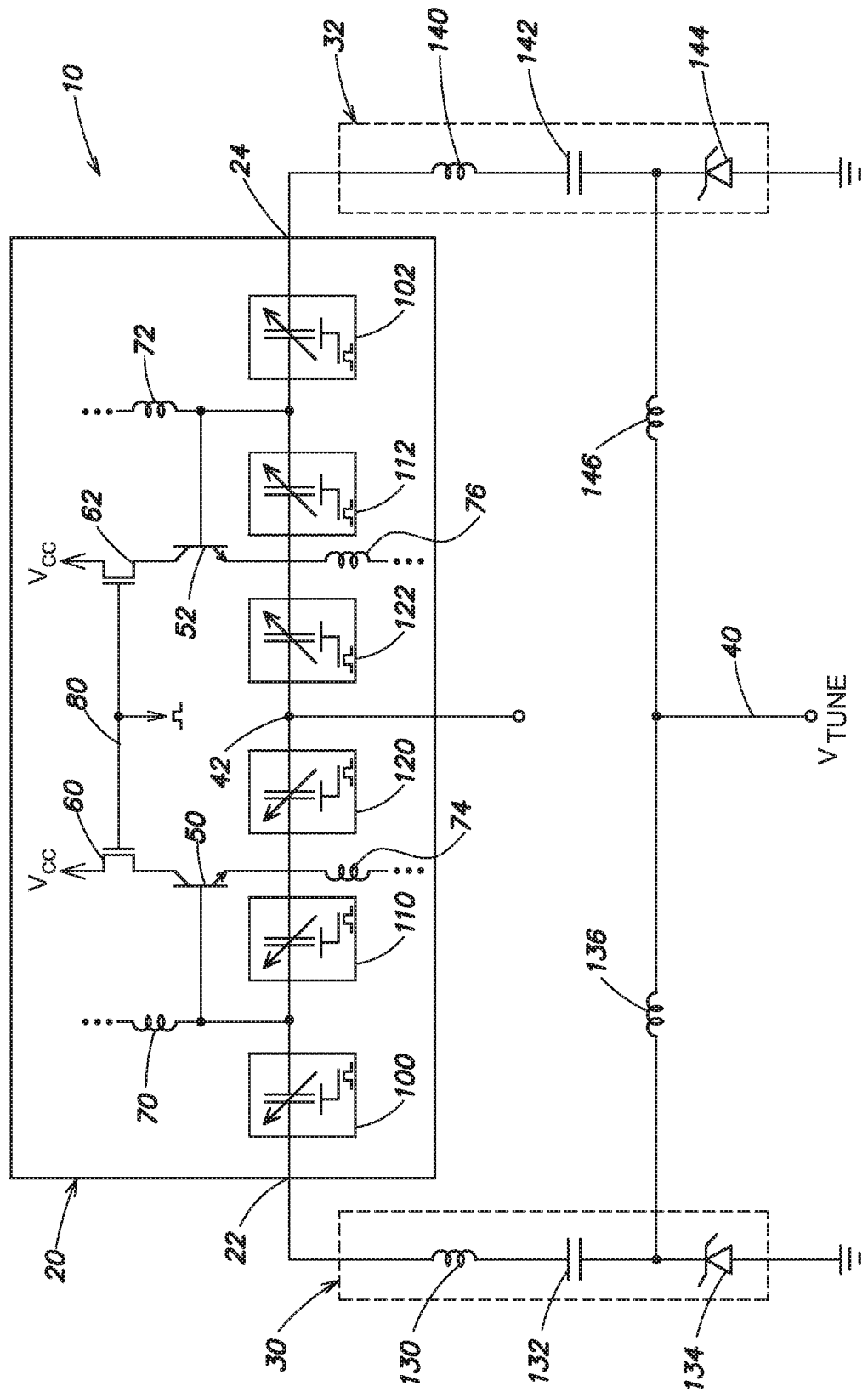
FIG. 1 is a schematic diagram of a voltage controlled oscillator in accordance with embodiments.

A schematic diagram of a voltage controlled oscillator in accordance with embodiments is shown in FIG. 1. The voltage controlled oscillator 10 includes an oscillator core circuit 20 having a first terminal 22 and a second terminal 24, a first LC resonator 30 coupled to first terminal 22 and a second LC resonator 32 coupled to second terminal 24. The voltage controlled oscillator 10 receives a tuning voltage VTUNE on a tuning input 40 and provides an RF oscillator output on an output 42.

The oscillator core circuit 20 includes a first transistor 50 and a second transistor 52. The collector of transistor 50 is coupled through a switch transistor 60 to a supply voltage VCC, and the collector of transistor 52 is coupled through a switch transistor 62 to supply voltage VCC. A base bias voltage is coupled through a choke inductor 70 to the base of transistor 50 and is coupled through a choke inductor 72 to the base of transistor 52. An emitter bias voltage, such as ground, is coupled through a choke inductor 74 to the emitter of transistor 50 and is coupled through a choke inductor 76 to the emitter of transistor 52. The gates of switch transistors 60 and 62 are coupled to a control line 80, which permits the oscillator core circuit 20 to be connected to or disconnected from supply voltage VCC.

A programmable capacitor 100 is coupled between the base of transistor 50 and the first terminal 22, and a programmable capacitor 102 is coupled between the base of transistor 52 and second terminal 24. A programmable capacitor 110 is coupled between the base and the emitter of transistor 50, and a programmable capacitor 112 is coupled between the base and the emitter of transistor 52. A programmable capacitor 120 is coupled between the emitter of transistor 50 and output 42, and a programmable capacitor 122 is coupled between the emitter of transistor 52 and the output 42. The programmable capacitors are discussed below.

The first LC resonator 30 includes an inductor 130, a fixed capacitor 132 and a variable capacitor 134 coupled in series between the first terminal 22 of oscillator core circuit 20 and ground. The tuning voltage VTUNE is supplied through a choke inductor 136 to variable capacitor 134, which may be implemented as a varactor diode.

The second LC resonator 32 includes an inductor 140, a fixed capacitor 142 and a variable capacitor 144 connected in series between the second terminal 24 of oscillator core circuit 20 and ground. The tuning voltage is supplied through a choke inductor 146 to variable capacitor 144, which may be implemented as a varactor diode. As discussed below, the fixed capacitors 132 and 142 and/or the variable capacitors 134 and 144 may be programmable in accordance with embodiments.

A negative resistance looking into the base of transistor 50 is a function of the transconductance of transistor 50, the values of capacitors 100 and 110 and frequency. If the magnitude of the negative resistance exceeds the losses of LC resonator 30, oscillation can occur at a frequency that is a function of the values of inductor 130, fixed capacitor 132 and variable capacitor 134. Tunability of the frequency of oscillation is achieved by varying the capacitance of variable capacitor 134 by changing the applied reverse bias across the terminals of the varactor diode. The tuning voltage applied to variable capacitor 134 thus controls the frequency of oscillation. The portion of the voltage controlled oscillator 10 including transistor 52, capacitors 102 and 112 and LC resonator 32 operates in the same manner to form a balanced VCO.

Figure 2:
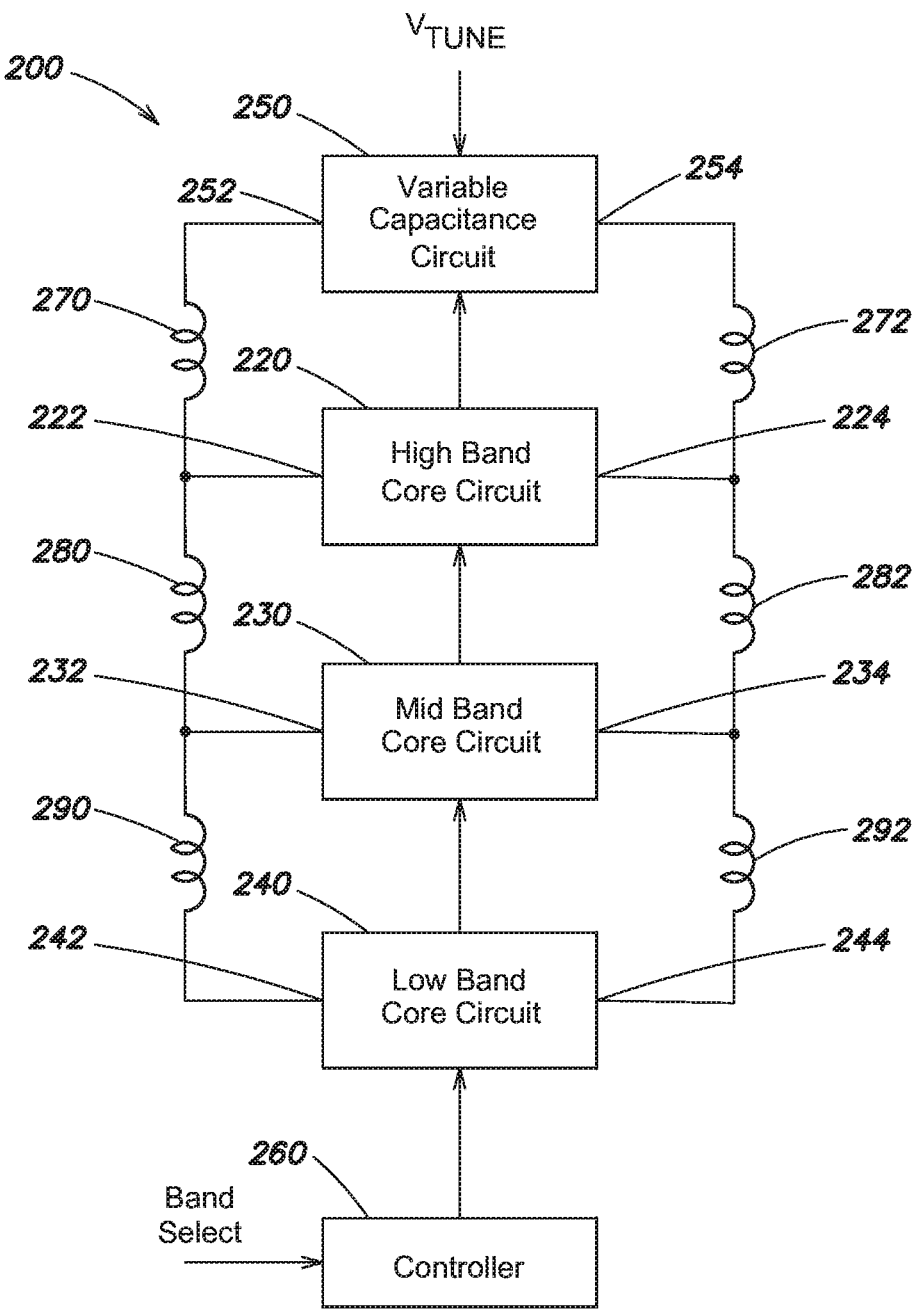
FIG. 2 is a schematic block diagram of a VCO circuit in accordance with embodiments.

A schematic block diagram of a voltage controlled oscillator 200 in accordance with embodiments is shown in FIG. 2. The voltage controlled oscillator 200 includes a high band core circuit 220, a mid band core circuit 230, a low band core circuit 240, a variable capacitance circuit 250, a controller 260 and inductors 270, 272, 280, 282, 290 and 292. The high band core circuit 220, the mid band core circuit 230 and the low band core circuit 240 may have the configuration of oscillator core circuit 20 shown in FIG. 1 and described above.

A first terminal 222 of high band core circuit 220 is coupled through inductor 270 to a first terminal 252 of variable capacitance circuit 250. A second terminal 224 of high band core circuit 220 is coupled through inductor 272 to a second terminal 254 of variable capacitance circuit 250. A first terminal 232 of mid band core circuit 230 is coupled through inductor 280 and inductor 270 to the first terminal 252 of variable capacitance circuit 250. A second terminal 234 of mid band core circuit 230 is coupled through inductor 282 and inductor 272 to the second terminal 254 of variable capacitance circuit 250. A first terminal 242 of low band core circuit 240 is coupled through inductor 290, inductor 280 and inductor 270 to the first terminal 252 of variable capacitance circuit 250. A second terminal 244 of low band core circuit 240 is coupled through inductor 292, inductor 282 and inductor 272 to the second terminal 254 of variable capacitance circuit 250.

The controller 260 controls the high band core circuit 220, the mid band core circuit 230 and the low band core circuit 240, such that only one of the core circuits 220, 230 and 240 operates at any given time. Further, the controller 260 programs the variable capacitance circuit 250 and the operating core circuit to provide a desired oscillator frequency.

As can be seen from FIG. 2, the first LC resonator of the high band core circuit 220 is formed by inductor 270 and the capacitance of variable capacitance circuit 250, and the second LC resonator of high band core circuit 220 is formed by inductor 272 and the capacitance of variable capacitance circuit 250. The first LC resonator of mid band core 230 is formed by inductors 280 and 270 and the capacitance of variable capacitance circuit 250, and the second LC resonator of mid band core circuit 230 is formed by inductors 282 and 272 and the capacitance of variable capacitance circuit 250. The first LC resonator of low band core circuit 240 is formed by inductors 290, 280 and 270 and the capacitance of variable capacitance circuit 250, and the second LC resonator of low band core circuit 240 is formed by inductors 292, 282 and 272 and the capacitance of variable capacitance circuit 250. Thus, the LC resonators of high band core circuit 220, mid band core circuit 230 and low band core circuit 240 have progressively larger inductances, which correspond to lower operating frequencies. It should be noted that only one of the core circuits 220, 230 and 240 is operational at a given time.

In operation, the controller 260 selects one of the core circuits 220, 230 and 240 in accordance with a band select input. The selected core circuit is enabled for operation and the non-selected core circuits are disabled. For example, the supply voltage VCC may be applied to the enabled core circuit by turning on switch transistors 60 and 62 (FIG. 1), and the switch transistors 60 and 62 may be turned off in the non-selected core circuits. In addition, the controller 260 may program the variable capacitance circuit 250 and the selected core circuit for operation in the selected frequency band, as discussed below.

Figure 3:
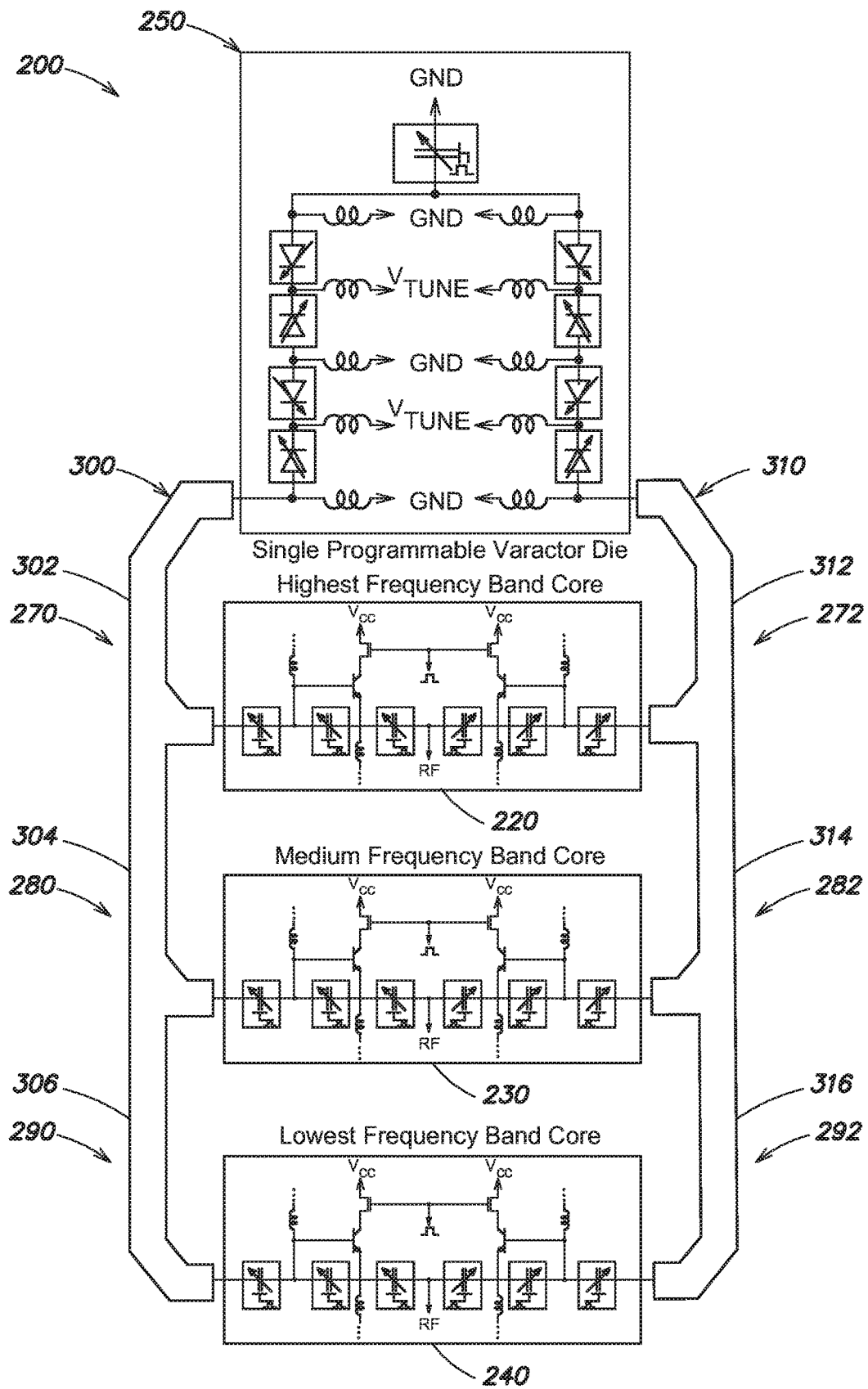
FIG. 3 is a schematic diagram of the VCO circuit of FIG. 2.

An implementation of voltage controlled oscillator 200 is shown in FIG. 3. Like elements in FIGS. 2 and 3 have the same reference numerals. The controller 260 is omitted from FIG. 3 for simplicity of illustration. As shown in FIG. 3, the inductors 270, 280 and 290 are implemented as a conductive trace 300 formed on a laminate substrate 710 (FIG. 7), and the inductors 272, 282 and 292 are implemented as a conductive trace 310 on the laminate substrate 710. A segment 302 of conductive trace 300 corresponds to inductor 270, a segment 304 of conductive trace 300 corresponds to inductor 280, and a segment 306 of conductive trace 300 corresponds to inductor 290. Similarly, a segment 312 of conductive trace 310 corresponds to inductor 272, a segment 314 of conductive trace 310 corresponds to inductor 282, and a segment 316 of conductive trace 310 corresponds to inductor 292. The physical parameters of the conductive traces 300 and 310, including the length, width, thickness and conductivity of each segment, determine the inductances of segments 302, 304, 306, 312, 314 and 316.

Figure 4:
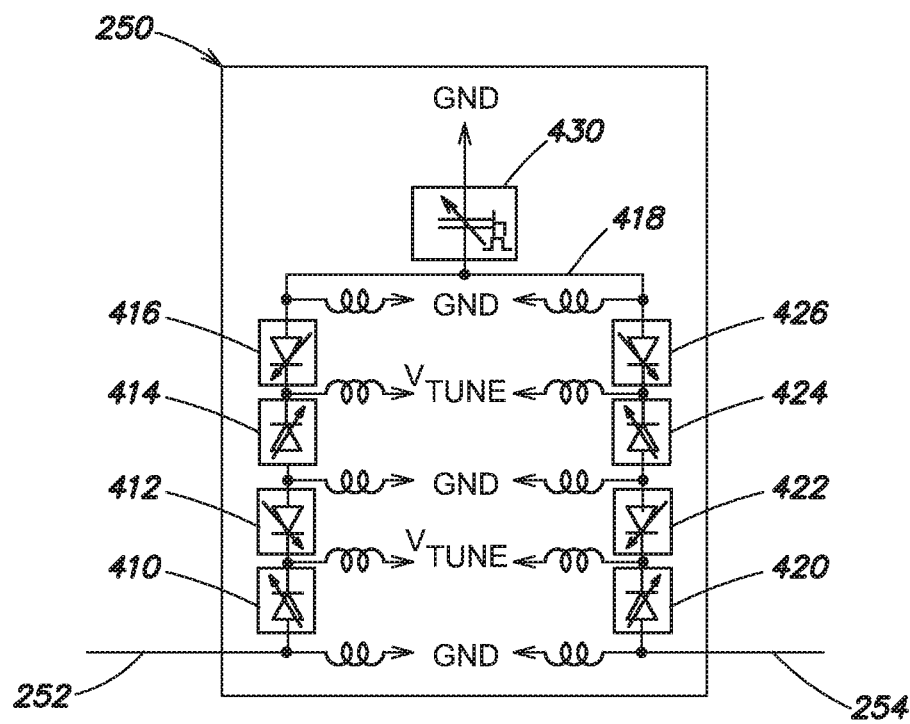
FIG. 4 is a schematic diagram of a variable capacitance circuit in accordance with embodiments.

A schematic diagram of variable capacitance circuit 250 in accordance with embodiments is shown in FIG. 4. The variable capacitance circuit 250 includes variable capacitance elements, specifically varactor elements 410, 412, 414 and 416 connected in series between first terminal 252 and a node 418. The varactor elements 410, 412, 414 and 416 have alternating polarities. The variable capacitance circuit 250 further includes varactor elements 420, 422, 424 and 426 connected between second terminal 254 and node 418. The varactor elements 420, 422, 424 and 426 have alternating polarities. The variable capacitance circuit 250 further includes a programmable capacitor 430 connected between node 418 and a reference voltage, such as ground.

The cathodes of varactor elements 410, 412, 414 and 416 are coupled through choke inductors to the tuning voltage VTUNE, and the anodes of varactor elements 410, 412, 414 and 416 are coupled through choke inductors to ground. Similarly, the cathodes of varactor elements 420, 422, 424 and 426 are coupled through choke inductors to the tuning voltage VTUNE, and the anodes of varactor elements 420, 422, 424 and 426 are coupled through choke inductors to ground.

The combination of varactor elements 410, 412, 414 and 416 corresponds to the variable capacitor 134 of LC resonator 30 shown in FIG. 1 and described above. The combination of varactor elements 420, 422, 424 and 426 corresponds to the variable capacitor 144 of LC resonator 32 shown in FIG. 1 and described above.

Each of the varactor elements 410, 412, 414, 416, 420, 422, 424 and 426 is both programmable and tunable. The varactor elements are programmable by adding or subtracting varactor diodes for operation in a selected frequency band. The varactor elements are then tunable in response to the tuning voltage VTUNE within the selected frequency band. The programmable capacitor 430 is also programmable in response to a control signal for operation within the selected frequency band.

The varactor elements 410, 412, 414, 416, 420, 422, 424 and 426, and the programmable capacitor 430 are programmed for operation in a selected frequency band in response to control signals from the controller 260 (FIG. 2). Then, the tuning voltage VTUNE controls the oscillator frequency within the selected band. The elements of variable capacitance circuit 250 can be reprogrammed by the control signals for operation in another selected frequency band, and the process is repeated. Each selected frequency band can be relatively narrow, which results in low phase noise.

Figure 5:
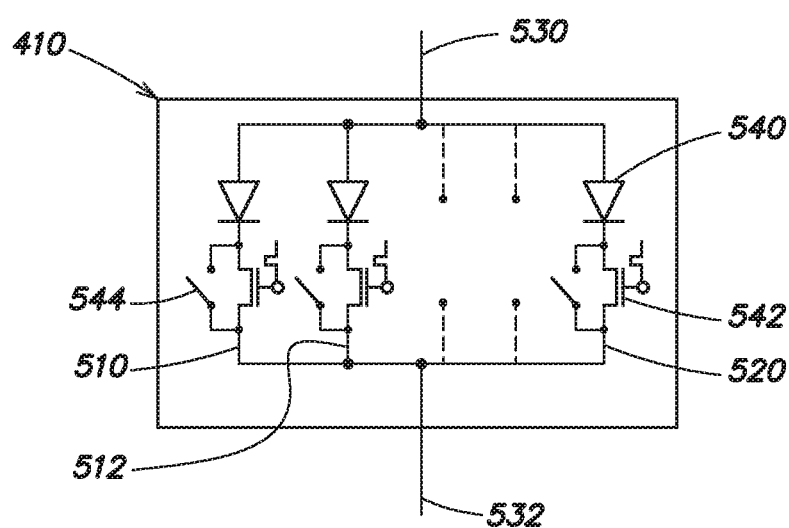
FIG. 5 is a schematic diagram of a programmable varactor element in the variable capacitance circuit of FIG. 4.

A schematic diagram of varactor element 410 in accordance with embodiments is shown in FIG. 5. The other varactor elements of variable capacitance circuit 250 may have the same configuration. The varactor element 410 includes several branch circuits 510, 512, . . . 520 connected in parallel between a first terminal 530 and a second terminal 532. Each branch includes a varactor diode 540 and a transistor switch 542 connected in series between terminals 530 and 532. Each branch may also include a switch 544 connected in parallel with transistor switch 542 to permit permanent programming. The varactor element 410 is programmed by turning on none, some or all of the transistor switches 542 to connect the respective varactor diodes 540 into the circuit. The capacitance of the varactor element 410 is increased by turning on more of the transistor switches 542 and conversely is decreased by turning off the transistor switches 542. When the varactor element 410 has been programmed for operation in a selected frequency band, the tuning voltage VTUNE is applied to second terminal 532 so as to vary the capacitance of the varactor diodes 540 in accordance with a desired tuning operation.

It will be understood that the varactor element 410 may have any number of branch circuits to provide programmability. Furthermore, the transistor switch 542 and the switch 544 may be omitted in one or more of the branch circuits, such that the varactor element 410 has a minimum capacitance value.

Figure 6:
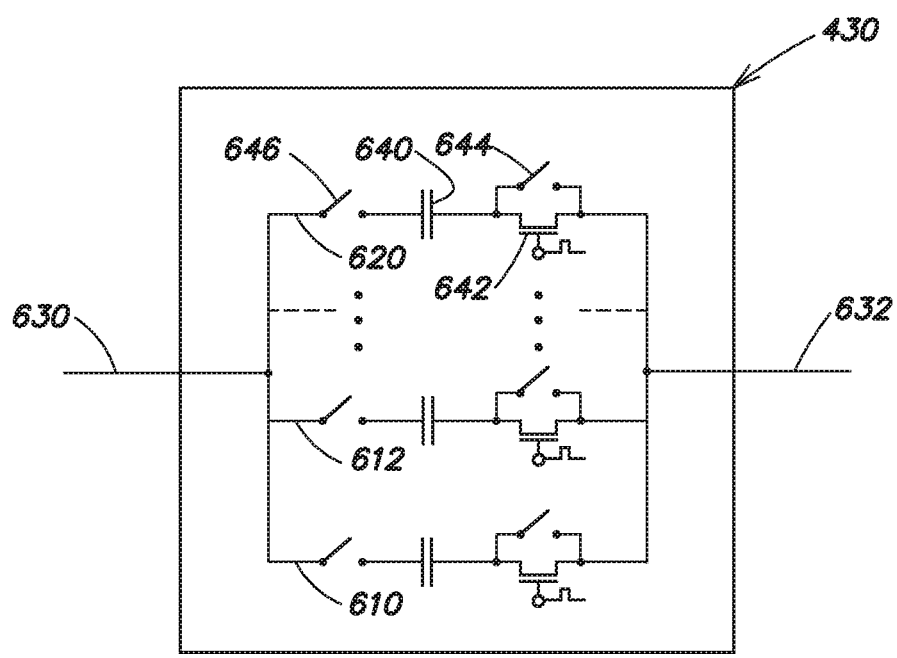
FIG. 6 is a schematic diagram of a programmable capacitance element in accordance with embodiments.

A schematic diagram of programmable capacitor 430 in accordance with embodiments is shown in FIG. 6. The programmable capacitor 430 includes several branch circuits 610, 612, . . . 620 connected in parallel between a first terminal 630 and a second terminal 632. Each of the branch circuits 610, 612, . . . 620 includes a capacitor 640 and a transistor switch 642 connected in series between terminals 630 and 632. Each branch circuit may further include first switch 644 connected in parallel with transistor switch 642 and a second switch 646 connected in series with capacitor 640, for permanent programming of each branch circuit.

The capacitance of the programmable capacitor 430 can be increased by connecting more branch circuits between terminals 630 and 632 and can be decreased by reducing the number of branch circuits connected between terminal 630 and 632. It will be understood that the values of the capacitor 640 in the respective branch circuits 610, 612, . . . 620 may be the same or different. Further, any number of branch circuits may be utilized to provide the desired programmability. The transistor switches 642 are turned on or off by control signals provided by the controller 260 (FIG. 2). The value of programmable capacitor 430 may be set for operation in a selected frequency band.

Figure 7:
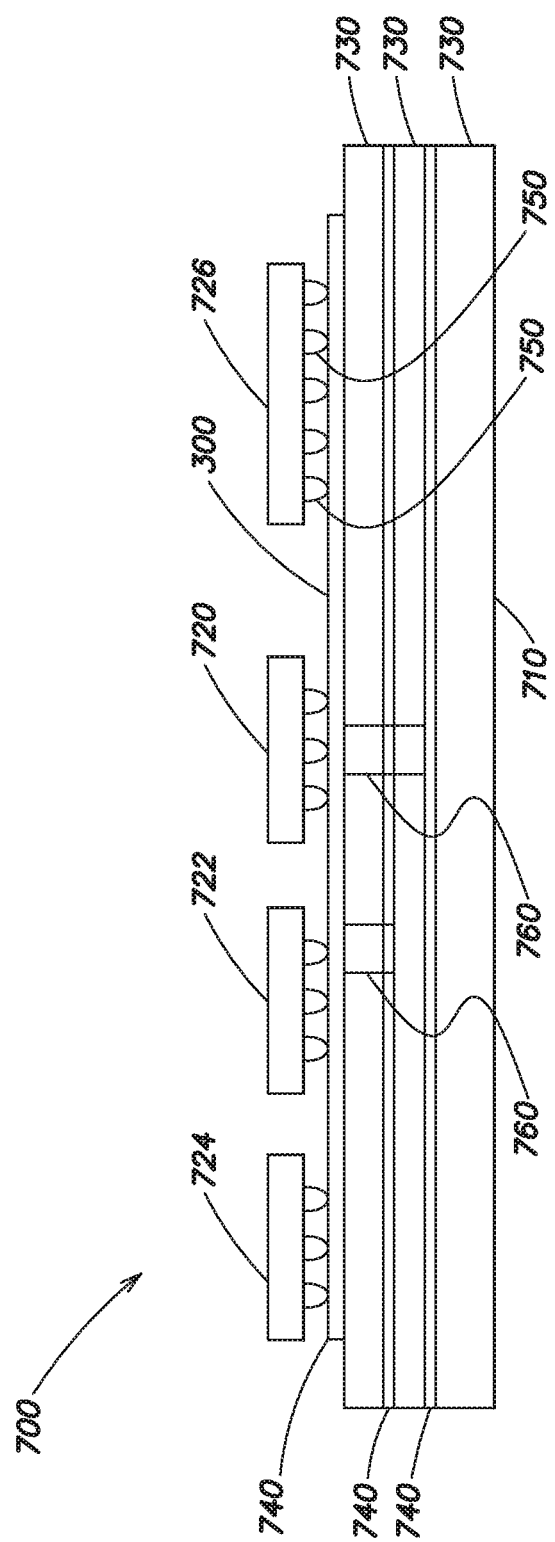
FIG. 7 is a cross-section of a laminate package in accordance with embodiments.

An implementation of the voltage controlled oscillator 200 of FIGS. 2 and 3 is shown in FIG. 7. A laminate assembly 700 includes a laminate substrate 710 and semiconductor substrates 720, 722, 724 and 726 mounted on laminate substrate 710. Semiconductor substrates 720, 722 and 724 correspond to high band core circuit 220, mid band core circuit 230 and low band core circuit 240, respectively. Semiconductor substrate 726 corresponds to variable capacitance circuit 250.

The laminate substrate 710 may include one or more dielectric layers 730 and one or more conductive layers 740 in an alternating configuration. The conductive layers 740 may serve as ground planes and/or may be patterned to provide conductive traces for interconnection of circuit elements. In particular, the upper conductive layer 740 may include conductive trace 300 shown in FIG. 3 and described above, which forms inductive elements for the voltage controlled oscillator circuit. The semiconductor substrates 720, 722, 724 and 726 are physically mounted to an upper surface of the laminate substrate 710 and are electrically connected to elements of the laminate substrate 710 by interconnect bumps 750. Connections between conductive layers 740 on different levels of the laminate substrate 710 may be provided by vias 760. A laminate-based voltage controlled oscillator is described in U.S. Pat. No. 9,209,744, which is hereby incorporated by reference.

The implementation of FIG. 7 includes four semiconductor substrates 720, 722, 724 and 726. However, this is not a limitation, and the circuitry can be partitioned among semiconductor substrates in any suitable manner. In one example, the core circuits 220, 230 and 240 may be fabricated on a first semiconductor substrate and the variable capacitance circuit 250 may be fabricated on a second semiconductor substrate. In another example, core circuits 220, 230 and 240 and variable capacitance circuit 250 may be fabricated on a single semiconductor substrate.

Figure 8:
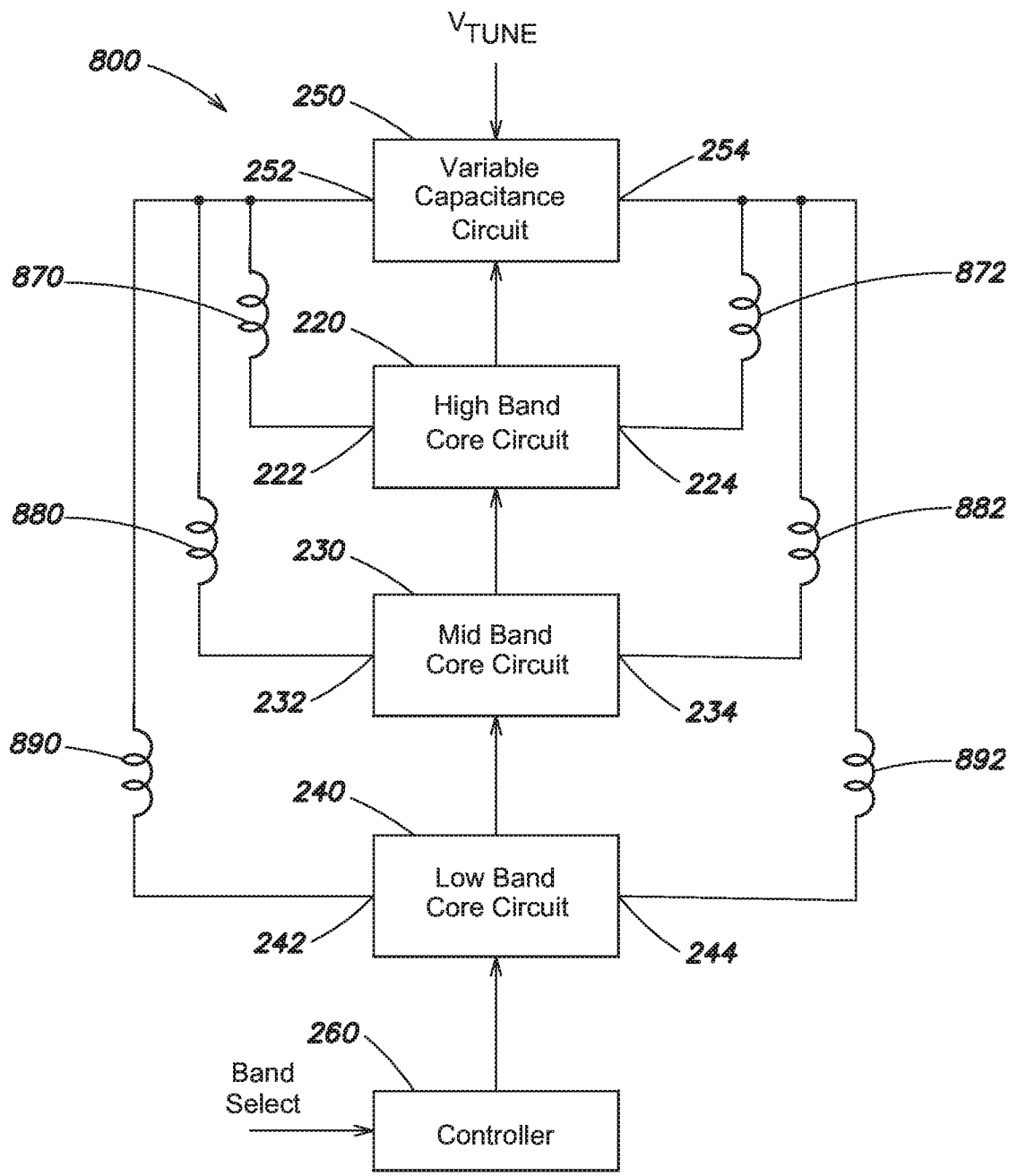
FIG. 8 is a schematic block diagram of a VCO circuit in accordance with further embodiments.

A schematic block diagram of a voltage controlled oscillator circuit in accordance with further embodiments is shown in FIG. 8. Like elements in FIGS. 2 and 8 have the same reference numerals and their descriptions will not be repeated.

As shown, a VCO circuit 800 includes high band core circuit 220, mid band core circuit 230, low band core circuit 240, variable capacitance circuit 250 and controller 260. The VCO circuit 800 of FIG. 8 differs from the VCO circuit 200 shown in FIG. 2 primarily with respect to the configuration of the inductors. In the VCO circuit 800, first terminal 222 of high band core circuit 220 is coupled through an inductor 870 to first terminal 252 of variable capacitance circuit 250. Second terminal 224 of high band core circuit 220 is coupled through an inductor 872 to second terminal 254 of variable capacitance circuit 250. First terminal 232 of mid band core circuit 230 is coupled through an inductor 880 to first terminal 252 of variable capacitance circuit 250. Second terminal 234 of mid band core circuit 230 is coupled through an inductor 882 to second terminal 254 of variable capacitance circuit 250. First terminal 242 of low band core circuit 240 is coupled through an inductor 890 to first terminal 252 of variable capacitance circuit 250. Second terminal 244 of low band core circuit 240 is coupled through an inductor 892 to second terminal 254 of variable capacitance circuit 250.

As can be seen in FIG. 8, each core circuit has its own dedicated inductors. The configuration of FIG. 8 has an advantage of greater flexibility in the values of the LC resonators for each of the high band core circuit 220, mid band core circuit 230 and low band core circuit 240. However, the inductors 870, 872, 880, 882, 890 and 892 may require more circuit space than the configuration of FIG. 2, resulting in a larger and more expensive package. In some embodiments, the inductors for each of the core circuits may be formed on different conductive layers in the laminate assembly 700 of FIG. 7.

Referring again to FIG. 1, the tuning voltage VTUNE applied to variable capacitors 134 and 144 controls the frequency of oscillation of voltage control oscillator 10. Further, the oscillation frequency of the voltage controlled oscillator 10 can be controlled by programming the values of capacitors 100, 102, 110, 112, 120 and 122, each of which can be implemented as shown in FIG. 6. Further, the fixed capacitors 132 and 142 and the variable capacitors 134 and 144 may be replaced with the variable capacitance circuit 250 shown in FIG. 4 and described above. As a result, the voltage controlled oscillator 10 can have multiple selectable bands and can be tuned by the tuning voltage VTUNE in the selected band. As a result, the voltage controlled oscillator 10 can have a wide tuning range and low phase noise.

Having thus described several aspects of several embodiments of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A voltage controlled oscillator comprising:
    a variable capacitance circuit comprising a plurality of variable capacitance elements, each having a capacitance that is a function of a tuning voltage;
    two or more oscillator core circuits each comprising transistors and capacitors, wherein the two or more oscillator core circuits are individually selectable to cause oscillation in different frequency bands; and
    inductive elements outside the oscillator core circuits that are connected between the variable capacitance circuit and the oscillator core circuits.

2. The voltage controlled oscillator as defined in claim 1, wherein the variable capacitance circuit is programmable in response to a control signal for operation in a selected frequency band.

3. The voltage controlled oscillator as defined in claim 1, wherein the variable capacitance circuit includes at least one programmable capacitance element.

4. The voltage controlled oscillator as defined in claim 1, wherein the inductive elements include a first inductive element and a second inductive element and wherein the variable capacitance circuit includes first and second branches connected to the first and second inductive elements, respectively.

5. The voltage controlled oscillator as defined in claim 1, wherein each of the oscillator core circuits includes at least one programmable capacitance circuit.

6. The voltage controlled oscillator as defined in claim 1, wherein each of the oscillator core circuits includes first and second negative resistance circuits.

7. The voltage controlled oscillator according to claim 1, wherein a first input of each of the oscillator core circuits is coupled by a first inductive element of the inductive elements to a first terminal of the variable capacitance circuit and a second input of each of the oscillator core circuits is coupled by a second inductive element of the inductive elements to a second terminal of the variable capacitance circuit.

8. The voltage controlled oscillator as defined in claim 1, wherein the inductive elements are formed on a laminate substrate.

9. The voltage controlled oscillator according to claim 8, wherein the variable capacitance circuit and the oscillator core circuits are formed on one or more semiconductor substrates, and the one or more semiconductor substrates are mounted on the laminate substrate.

10. The voltage controlled oscillator according to claim 8, wherein the variable capacitance circuit and the oscillator core circuits are formed on a single semiconductor substrate and the semiconductor substrate is mounted on the laminate substrate.

11. The voltage controlled oscillator as defined in claim 1, wherein the variable capacitance circuit comprises varactor elements, each varactor element including two or more branches, each branch comprising a varactor diode and a switch connected in series.

12. The voltage controlled oscillator as defined in claim 3, wherein the programmable capacitance element includes a plurality of parallel branches, each parallel branch comprising a switch connected in series with a capacitor.

13. The voltage controlled oscillator as defined in claim 1, wherein the two or more oscillator core circuits comprise a high band oscillator core circuit, a mid band oscillator core circuit and a low band oscillator core circuit.

14. The voltage controlled oscillator as defined in claim 13, wherein the inductive elements include a first inductor connected between the variable capacitance circuit and the high band oscillator core circuit, a second inductor connected between the high band oscillator core circuit and the mid band oscillator core circuit, and a third inductor connected between the mid band oscillator core circuit and the low band oscillator core circuit.

15. The voltage controlled oscillator as defined in claim 13, wherein the inductive elements include a first inductor connected between the high band oscillator core circuit and the variable capacitance circuit, a second inductor connected between the mid band oscillator core circuit and the variable capacitance circuit, and a third inductor connected between the low band oscillator core circuit and the variable capacitance circuit.

16. The voltage controlled oscillator as defined in claim 1, further comprising a control circuit configured to provide control signals to the variable capacitance circuit and to the oscillator core circuits.

17. A voltage controlled oscillator comprising:
a variable capacitance circuit comprising a plurality of variable capacitance elements, each responsive to a tuning voltage;
two or more oscillator core circuits each comprising transistors and capacitors, wherein the two or more oscillator core circuits are individually selectable to cause oscillation in different frequency bands and wherein the variable capacitance circuit and the two or more oscillator core circuits are formed on one or more semiconductor substrates; and
inductive elements formed on a laminate substrate outside each oscillator core circuit of the two or more oscillator core circuits and connected between the variable capacitance circuit and the oscillator core circuits, wherein the one or more semiconductor substrates are mounted on the laminate substrate and are electrically connected to the laminate substrate.

18. The voltage controlled oscillator as defined in claim 17, wherein the oscillator core circuits each include at least one programmable capacitance circuit.

19. The voltage controlled oscillator as defined in claim 17, wherein the variable capacitance circuit comprises varactor elements, each varactor element including two or more branches, each branch comprising a varactor diode and a switch connected in series.

20. The voltage controlled oscillator as defined in claim 17, further comprising a control circuit configured to provide control signals to the variable capacitance circuit and to the oscillator core circuits.

21. The voltage controlled oscillator as defined in claim 17, wherein the oscillator core circuits do not include a transformer.

* * * * *